US007135259B2

(12) United States Patent
Chen et al.

(10) Patent No.: US 7,135,259 B2
(45) Date of Patent: Nov. 14, 2006

(54) SCATTEROMETRIC METHOD OF MONITORING HOT PLATE TEMPERATURE AND FACILITATING CRITICAL DIMENSION CONTROL

(75) Inventors: Li-Jui Chen, Hsinchu (TW);
Chih-Ming Ke, Hsin-Chu (TW);
Bang-Ching Ho, Hsinchu (TW);
Jen-Chieh Shih, Yungkang (TW);
Tsai-Sheng Gau, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 280 days.

(21) Appl. No.: 10/447,010

(22) Filed: May 28, 2003

(65) Prior Publication Data

US 2004/0241561 A1     Dec. 2, 2004

(51) Int. Cl.
*H01L 21/66* (2006.01)
(52) U.S. Cl. .................. 430/30; 430/330; 430/290; 438/16; 438/7; 356/957
(58) Field of Classification Search ............... None
See application file for complete search history.

(56) References Cited

U.S. PATENT DOCUMENTS

| 5,156,461 | A | 10/1992 | Moslehi et al. |
| 5,823,681 | A | 10/1998 | Cabib et al. |
| 5,926,690 | A | 7/1999 | Toprac et al. |
| 6,051,349 | A | 4/2000 | Yoshioka et al. |
| 6,081,658 | A | 6/2000 | Rieger et al. |
| 6,289,499 | B1 | 9/2001 | Rieger et al. |
| 6,350,390 | B1 | 2/2002 | Liu et al. |
| 6,388,253 | B1 | 5/2002 | Su |
| 6,423,457 | B1 | 7/2002 | Bell |
| 6,433,878 | B1 | 8/2002 | Niu et al. |
| 6,625,512 | B1 | 9/2003 | Goodwin |
| 6,630,361 | B1 | 10/2003 | Singh et al. |
| 6,645,780 | B1 | 11/2003 | Sonderman et al. |
| 6,658,144 | B1 * | 12/2003 | Hatab ..................... 382/144 |

OTHER PUBLICATIONS

Allgair et al., "Manufacturing Considerations for Implementation of Scatterometry for Process Monitoring", Metrology, Inspection, and Process Control for Microlithography XIV, Proceedings of SPIE vol. 3998, 2000, pp. 125-134.
Bishop et al., "Grating Line Shape Characterization Using Scatterometry", SPIE vol. 1545 International Conference on the Application and Theory of Periodic Structures (1991), pp. 64-73.

* cited by examiner

*Primary Examiner*—John A. McPherson
*Assistant Examiner*—Daborah Chacko-Davis
(74) *Attorney, Agent, or Firm*—Duane Morris LLP

(57) ABSTRACT

A method of determining temperatures at localized regions of a substrate during processing of the substrate in a photolithography process includes the following steps: independently illuminating a photoresist layer including a photoresist pattern at a plurality of locations on the substrate with a light source, so that light is diffracted off the plurality of locations of the photoresist pattern; measuring the diffracted light from the plurality of locations to determine measured diffracted values associated with respective locations from the plurality of locations; and comparing the measured diffracted values against a library to determine a pre-illumination process temperature of the photoresist layer at the plurality of locations.

20 Claims, 4 Drawing Sheets

_US 7,135,259 B2_

SCATTEROMETRIC METHOD OF MONITORING HOT PLATE TEMPERATURE AND FACILITATING CRITICAL DIMENSION CONTROL

FIELD OF THE INVENTION

The present invention relates to integrated circuit manufacturing, and more specifically to photolithography process monitoring techniques.

BACKGROUND OF THE INVENTION

Critical dimension control is important in integrated circuit manufacturing processes, particularly during photolithography processes. Controlling critical dimensions is becoming increasingly important as line widths of resist patterns fall within the deep sub-micron range. Various processing parameters, such as the amount of exposure to light, developing time and pre-exposure and post-exposure baking temperatures effect critical dimensions. Therefore, accurate monitoring of these process parameters and critical dimensions are also important.

Presently, critical dimensions are determined by actually measuring line width of the resist pattern for sample wafers. The measurements are typically taken by cross-section scanning electron beam (SEM) metrology. This method, however, is both destructive and slow, eliminating its use for in-situ process monitoring.

As mentioned, one parameter that effects critical dimension is baking temperature, including both pre-exposure and post-exposure baking temperature. Presently, hot plate temperature is monitored using a plurality of sensors mounted on the backside of the testing wafer during a maintenance test. This technique suffers from several drawbacks. First, the technique is not used to monitor temperature during actual process runs. Therefore, no real time correction can be implemented using the test run temperature data. Also, the sensors measure temperature at the bottom surface of the wafer proximate to the hot plate, but not at the actual photoresist layer. It may be that the sensors indicate a uniform temperature distribution across the hot plate, but the temperature at the photoresist layer is not necessarily uniform, and vice versa. The measured temperature is not necessarily the temperature realized by the photoresist layer above the monitored regions because it does not account for the conductance of the various layers that separate the photoresist from the silicon substrate.

Therefore, there still remains a need for a non-destructive method of determining temperature at localized regions of a photoresist layer during processing and a method of utilizing this information to control critical dimensions.

SUMMARY OF THE INVENTION

A method of determining temperatures at localized regions of a substrate during processing of the substrate in a photolithography process includes the following steps: independently illuminating a photoresist layer including a photoresist pattern at a plurality of locations on the substrate with a light source, so that light is diffracted off the plurality of locations of the photoresist pattern; measuring the diffracted light from the plurality of locations to determine measured diffracted values associated with respective locations from the plurality of locations; and comparing the measured diffracted values against a library to determine a pre-illumination process temperature of the photoresist layer at the plurality of locations.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

A method of monitoring processing temperatures in a photolithography process is provided. A method of utilizing monitoring data to control critical dimensions in a photoresist pattern is also provided.

Photolithography processes have several steps, as detailed in U.S. Pat. No. 6,051,349 to Yoshioka, et al. entitled "Apparatus for Coating Resist and Developing the Coated Resist," the entirety of which is hereby incorporated by reference herein. Generally, the photolithography process includes an exposure step where a photoresist layer deposited over a substrate is exposed to a light pattern to provide a latent image therein and a development process that leaves a developed photoresist pattern used in subsequent processing steps (e.g., etching).

The lithography process also typically includes one or more baking steps both before (pre-exposure bake) and after (post-exposure bake) the exposure step. The wafer is typically placed on or proximate to a hot plate, which includes several (often up to ten) individual heating elements for producing heat at different regions of the hot plate. As mentioned in the "Background" section, the heat experienced by the photoresist layer formed over the substrate is not always uniform, leading to localized variations in critical dimensions (e.g., profile shape and line and space width of the photoresist pattern). A non-destructive method for monitoring these processing temperatures during the photolithography process and of using this collected data are described below in connection with FIGS. 1–4.

Figure 1:
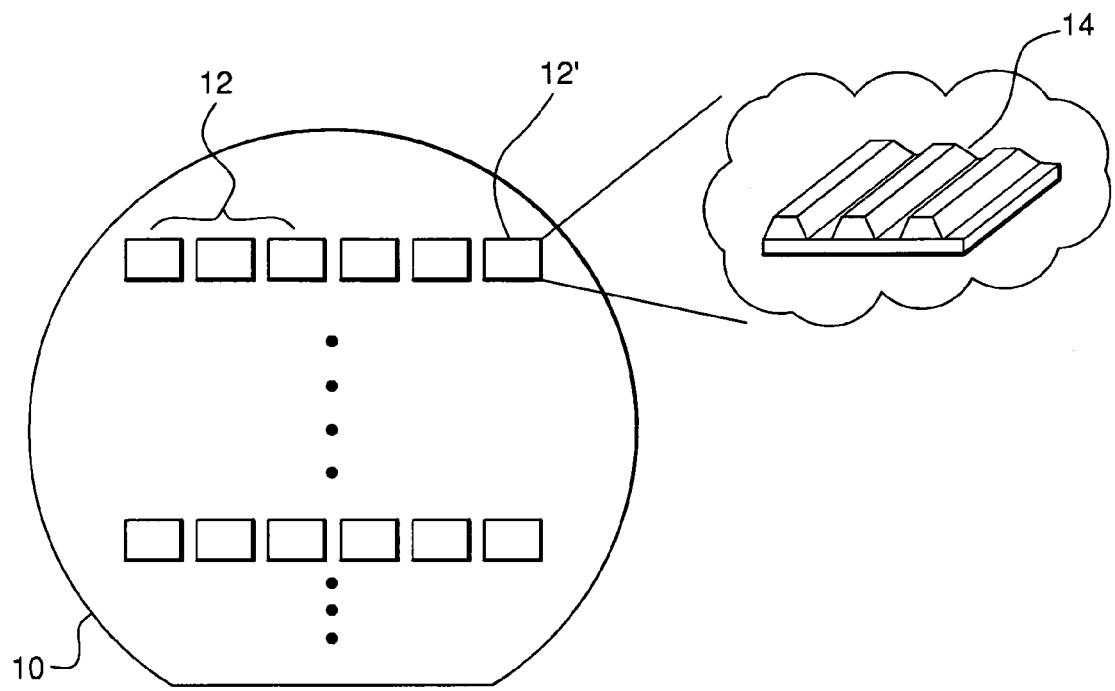
FIG. 1 is a top plan view of wafer having a plurality of die areas thereon.

FIG. 1 illustrates a top plan view of a semiconductor wafer 10 being processed in an intermediate stage of an integrated circuit fabrication process. As is typical, the wafer 10 includes a plurality of identical die locations 12 thereon, each of which eventually forms an integrated circuit. As illustrated in FIG. 1, an optical grating structure 14 is formed at integrated circuit die location 12'. The grating structure is formed from a photoresist layer coated onto the substrate during one of the many photolithography steps utilized in the typical integrated circuit fabrication process. The pattern for the grating structure may be designed into the mask used to expose the photoresist layer to the selected light pattern. In an exemplary embodiment, a plurality of grating structures are formed over the substrate 10. For example, a grating structure can be formed proximate or within each die location 12. One of ordinary skill will recognize that there are many die locations on a typical semiconductor wafer, and the number of locations increases with the size of the wafer, i.e., from a 6" wafer, to an 8" wafer to a 12" wafer.

Although the grating structure of FIG. 1 is shown in three dimension, meaning that the photoresist layer has already been developed, a latent image grating structure (i.e., pre-development) may also be used in the process described below. For example, for some e-beam sensitive photoresists, the latent image after e-beam exposure can be distinguished.

Figure 2:
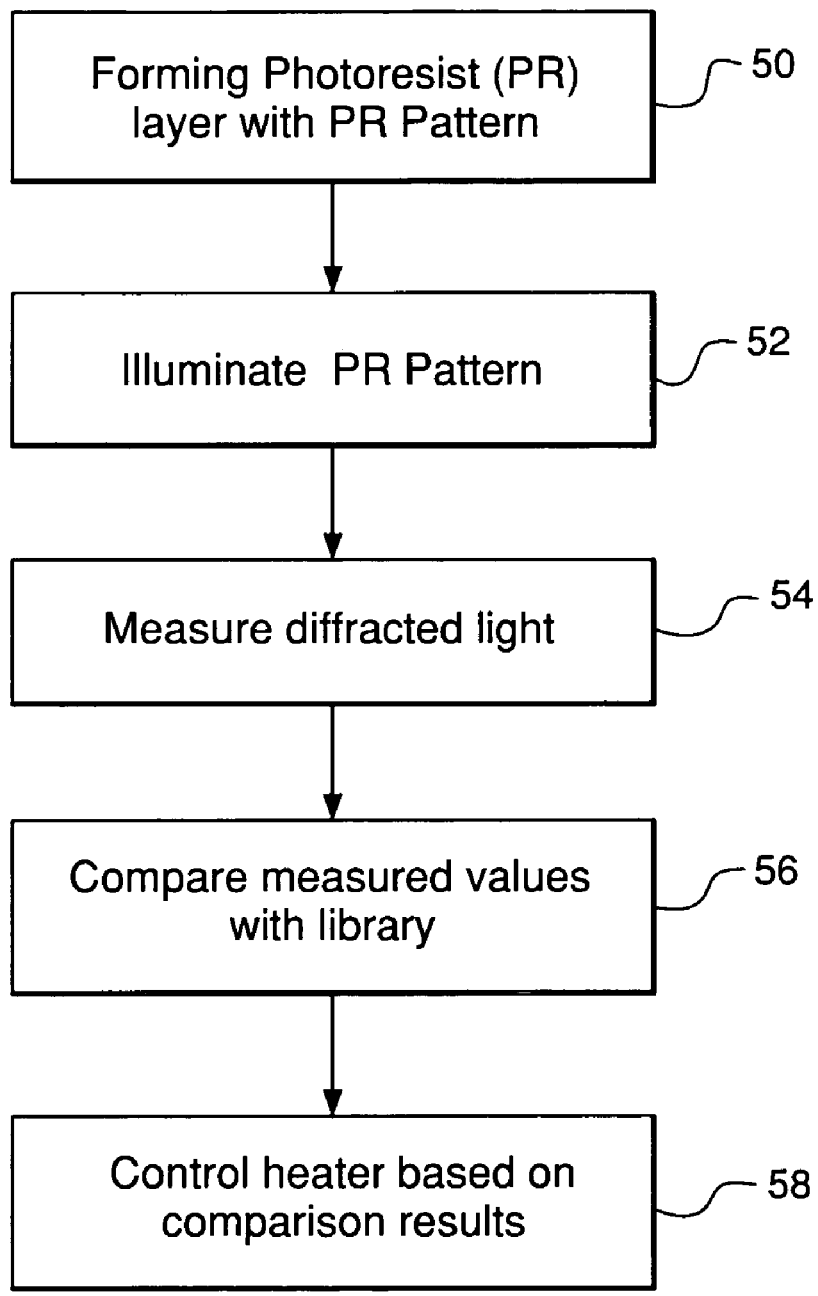
FIG. 2 illustrates a method of monitoring photolithography processing temperature.

Referring to FIG. 2, a photoresist layer with a photoresist pattern is formed over a substrate 10 (step 50). The photoresist pattern includes the plurality of grating structures described in connection with FIG. 1, either in developed or latent form. The grating structures are used in a scatterometry process to identify the profiles of the grating structures. Scatterometry is a known procedure by which a grating profile is reconstructed based on its optical diffraction response. The profile shape reveals important critical dimension information such as the top, bottom, and middle widths of a line, sidewall angle, degree of necking at the base of the photoresist line, and photoresist thickness. The details of a scatterometric system and method are provided in, for example, K. P. Bishop, et al. "Grating Line Shape Characterization Using Scatterometry", SPIE, Vol. 1545, February 1991, pp. 64–73, the entirety of which is hereby incorporated by reference herein.

The photoresist pattern is then illuminated with a scatterometric light source at the grating locations (step 52). Each grating location is independently illuminated by the light source so that light is separately diffracted off each respective grating location of the photoresist pattern. The scattered, diffracted light is captured and measured from each of the plurality of grating locations to determine measured diffracted values associated with respective locations from the plurality of locations (step 54). The measured values are then compared against a library (with the aid of comparison software), which includes data correlating specific spectral patterns, which correspond to respective profile shapes, with processing temperatures that produce the respective profile shapes (step 56).

Assume, for example, that steps 52–54 occur after exposure of the photoresist layer but before any post-exposure baking steps and development. The latent image at this point in the photolithography process has dimensions that are dependent in part on the pre-exposure bake temperature (also called soft bake temperature) uniformity across the photoresist layer, i.e., non-uniform temperature distribution across the photoresist layer can lead to non-uniform critical dimensions within the patterned layer. In this example, the measured values at step 54 are compared against library data at step 56 that include data correlating specific latent image photoresist profiles with specific pre-exposure bake temperatures. This comparison finds the best match between the measured values and the library data. Generation of the library data is discussed later.

The comparison step indirectly provides temperature information at the specific grating locations. Once a measured value is matched to a profile in the library, the pre-exposure bake temperature is known for that region. In this manner, the temperature distribution across the wafer can be determined.

In one embodiment, the comparison step 56 utilizes regression techniques to find the best match. A statistical difference algorithm such as Partial-Least-Squares (PLS) or Minimum-Mean-Square-Error (MMSE) may be used to determine the best fit.

In a second example, assume that steps 52–54 occur after exposure of the photoresist, after a first-post-exposure baking step, but before development of the exposed photoresist layer. The latent image at this point in the photolithography process has dimensions that are dependent in part on the first post-exposure bake temperature uniformity across the photoresist layer, i.e., non-uniform temperature distribution across the photoresist layer can lead to non-uniform critical dimensions within the patterned layer. In this example, the measured values at step 54 are compared against library data at step 56 that include data correlating specific latent image photoresist profiles with specific first post-exposure bake temperatures. These first two baking processes (pre-exposure bake (example one) and first post-exposure bake (example two)) are believed to have the most significant effect on critical dimensions and photoresist profile shape.

In a third example, assume that steps 52–54 occur after development of the exposed photoresist layer and before a post-development baking step. The developed image at this point in the photolithography process has dimensions that are again dependent in part on the first post-exposure bake temperature uniformity across the photoresist layer, i.e., non-uniform temperature distribution across the photoresist layer can lead to non-uniform critical dimensions within the developed, patterned layer. In this example, the measured values at step 54 are compared against library data at step 56 that include data correlating specific developed image photoresist profiles with specific first post-exposure bake temperatures.

In a last example, assume that steps 52–54 occur after development of the exposed photoresist layer and after a post-development baking step. The developed image at this point in the photolithography process has dimensions that are dependent in part on the post-development bake temperature uniformity across the photoresist layer, i.e., non-uniform temperature distribution across the photoresist layer can lead to non-uniform critical dimensions within the developed patterned layer. In this example, the measured values at step 54 are compared against library data at step 56 that include data correlating specific developed image photoresist profiles with specific post development bake temperatures.

Figure 1A:
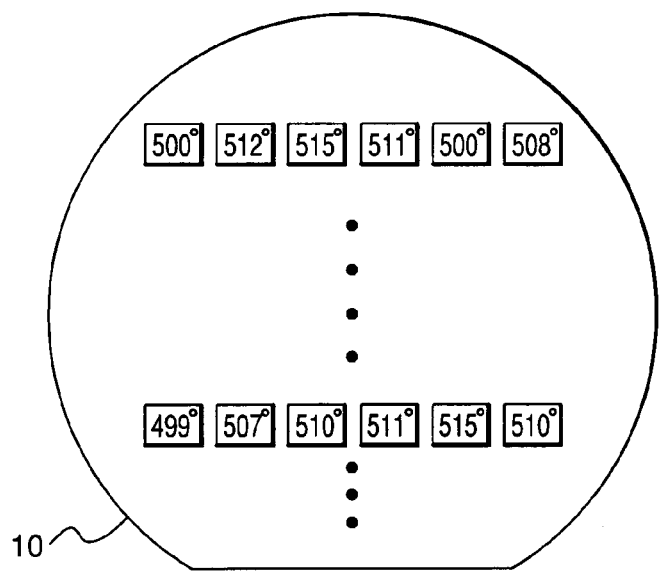

As mentioned, once the comparison has been made at step 56, the temperature distribution for the semiconductor substrate at the grating locations is known, as illustrated by, for example, FIG. 1A. This information can be used to control one or more heaters used in the photolithography process, such as to create a uniform heat distribution profile at the photoresist layer for subsequently processed wafers and/or to adjust heat regions in subsequent heating steps to account for the detected non-uniformity. The heaters used in the lithography process typically include a plurality of heating elements, at various regions of the hot plate, that can be individually controlled. This may be done in a feed forward loop to control a subsequent heater(s) to correct for any non-uniformities in critical dimension or feed back loop to ensure uniform heat profiles for subsequently processed wafers, or both. With respect to the feed forward loop, the method and system provide the opportunity to salvage "out of spec" wafers (i.e., wafers with photoresist patterns that are not within acceptable ranges for critical dimensions) that may have otherwise been lost. The feed back loop ensures that critical dimensions on subsequently processed wafers will be within tolerance. In another example, an operator is notified when an unacceptable heat distribution profile is detected, so that the operator can investigate the source of the problem (e.g., a defective heating element).

The library can be populated with data in several ways. For example, library data can be generated using a theoretical model of the lithography process under varied temperature conditions at the various baking stages. The generation of signature libraries (as well as several matching algorithms) using modeling algorithms is described in Allgair et al., "Manufacturing Considerations for Implementation of Scatterometry for Process Monitoring" Proceedings of SPIE Vol. 3998 (2000), pp. 125–134, the entirety of which is hereby incorporated by reference herein. Theoretical resultant photoresist profiles are generated for each processing temperature (and at, for example, the various processing stages discussed above in examples one through four), theoretical scatterometric spectra are then generated for each profile, which can be compared against the measured spectra values to find the best match. In a second example, the temperature library data are generated through processing actual wafers. A small region on a wafer may be selected in which temperature is well characterized and defined, for example, at the center of a bare semiconductor wafer on a hot plate. The photoresist layer is provided directly on the bare semiconductor wafer. The scatterometric spectra is then gathered under these defined conditions and optionally for each stage in the process described above in examples one through four. In the next wafer run, the temperature is changed slightly, and the scatterometric spectra is again gathered. In this manner, the library can be populated with spectral data representing various profiles obtained under various temperature conditions.

Figure 3:
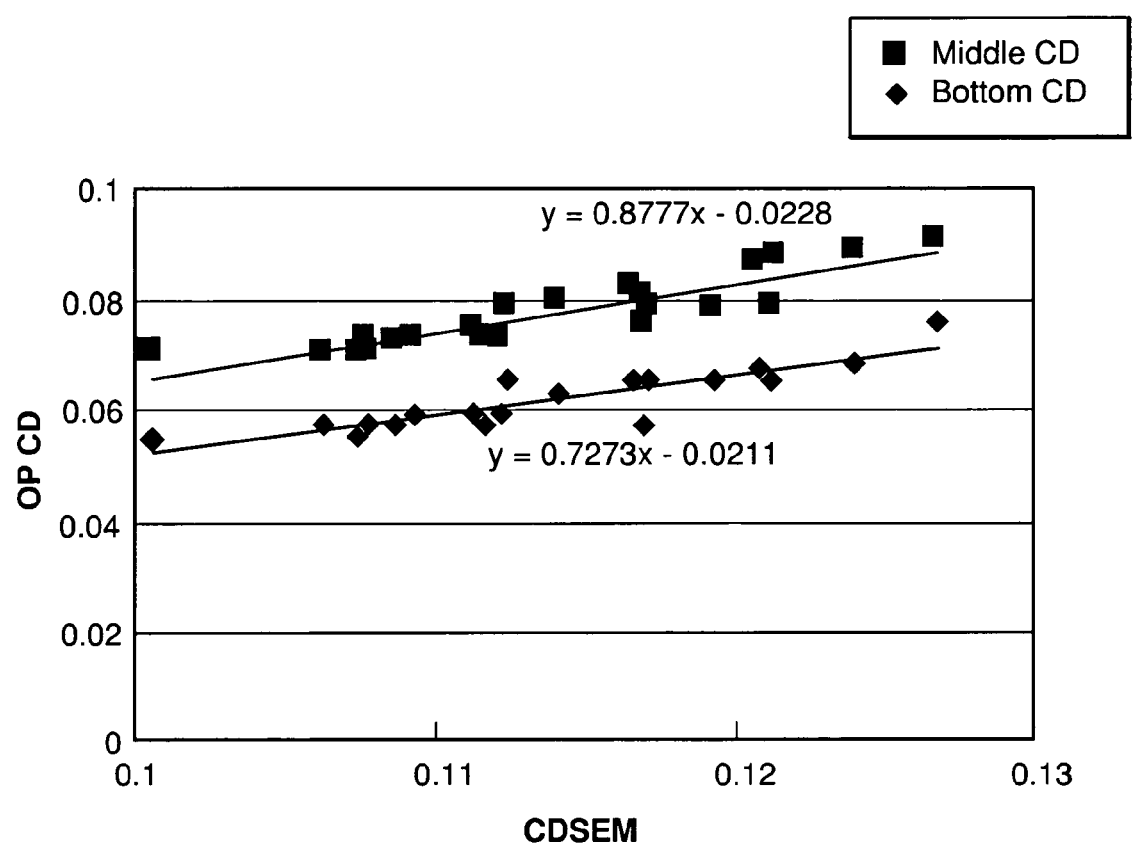
FIG. 3 is a plot of experimental data comparing critical dimension measurements made with SEM and scatterometry techniques.

An experiment was conducted to compare critical dimension measurement results obtained by scatterometry techniques and SEM (scanning electron microscope) techniques. In the experiment, the exposure dose was changed along the X-axis and exposure focus was changed along the Y-axis, such that each die location was exposed to a unique combination of dose and focus. The profiles of the exposed and developed areas were obtained using scatterometry and SEM. The critical dimension data were then plotted to observe the correlations between the critical dimension data from the SEM and the scatterometry techniques. A plot of the results is shown in FIG. 3. The correlation between the scatterometric data and SEM data appears to be linear with a good correlation coefficient greater than 0.9. A correlation coefficient above 0.8 generally indicates a good correlation.

As mentioned, FIG. 3 shows the correlation between the measured critical dimension data using scatterometry (labeled OP CD on the Y-axis) and SEM (labeled CDSEM on the X-axis) for the middle critical dimension (i.e., the width of a photoresist line at 50% of its height) and the bottom critical dimension (i.e., the width of a photoresist line at between about 0–10% of its height). The units are in micrometers. The plot indicates the critical dimension measurement of OP CD v. CDSEM at the analyzed die points. Ideally, the slope should be one and the offset should be zero for matching two measuring techniques. However, in practice, no two measurement techniques match identically. A linear matching correlation is shown in the plot, and the slope and offset can be regarded as a calibration factor.

Figure 4:
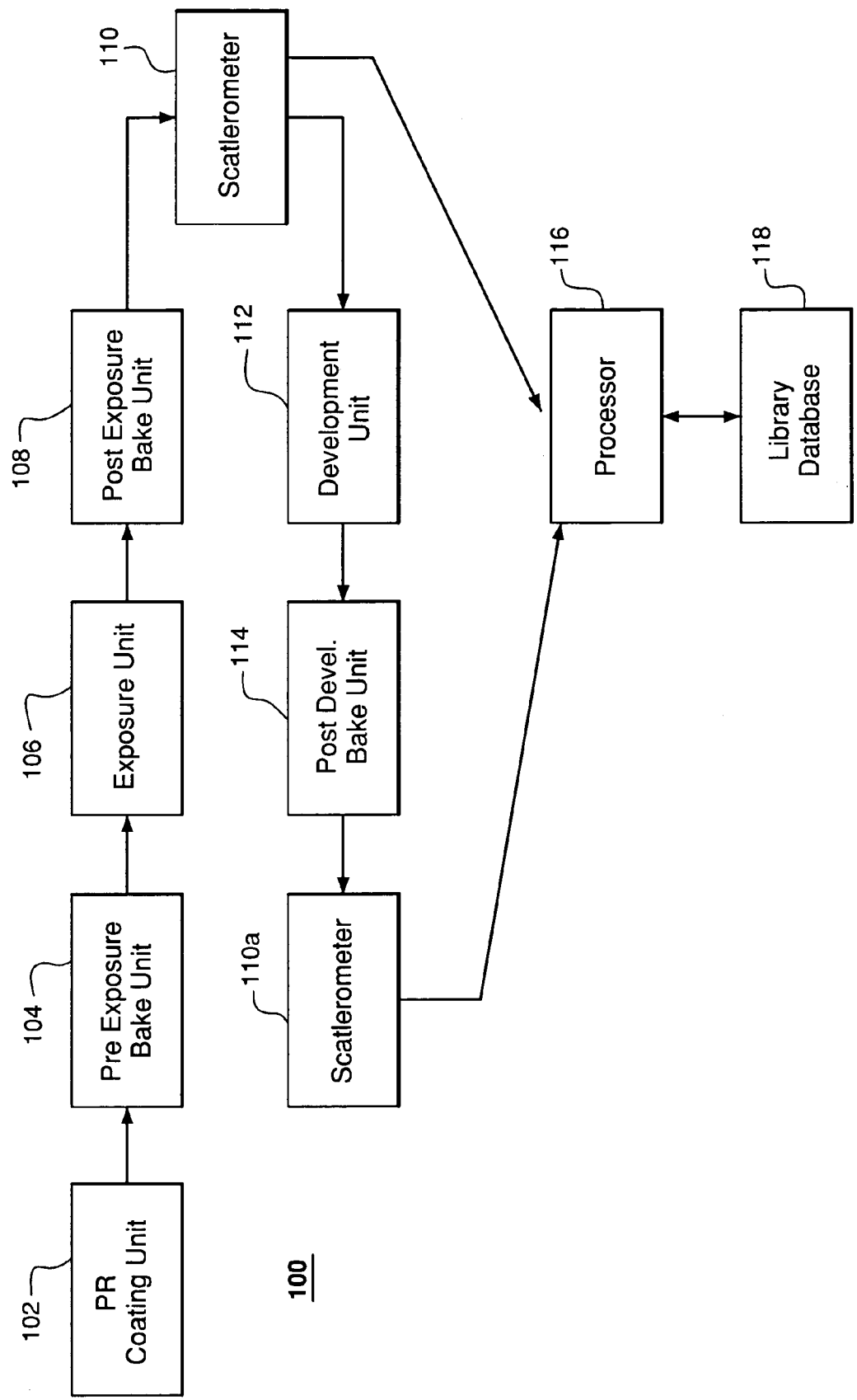
FIG. 4 is a system diagram of a photolithography system.

FIG. 4 is a simplified block diagram of a photolithography system 100. The system includes a photoresist coating unit 102 that coats a wafer with photoresist, a pre-exposure bake unit 104, an exposure unit 106, a post-exposure bake unit 108, a development unit 112 and a post development bake unit 114. The system 100 also includes at least one scatterometer 110 for measuring critical dimension. The scatterometer 110 is shown disposed after the post-exposure bake unit 108 and before the development unit 112, but this is by no means a requirement. For example, the scatterometer 110 could be disposed after one or more of bake unit 114 (i.e., scatterometer 110a), development unit 112 or exposure unit 106. Still further, the scatterometer 110 may be disposed within a chamber housing any of the bake units. The system 100 also includes a processor 116 coupled to the scatterometer for processing the measured spectral values and performing the comparison with the library data stored in library database 118.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of determining temperatures at localized regions of a substrate during processing of said substrate in a photolithography process, comprising the following steps:
   independently illuminating a photoresist layer including a photoresist pattern at a plurality of locations on said substrate with a light source, so that light is diffracted off said plurality of locations of said photoresist pattern;
   measuring said diffracted light from said plurality of locations to determine measured diffracted values associated with respective locations from said plurality of locations; and
   comparing said measured diffracted values against a library correlating diffracted values to respective processing temperatures of said photoresist layer; and
   from said comparison, determining a pre-illumination processing temperature distribution, said distribution comprising processing temperatures for said respective locations from said plurality of locations.

2. The method of claim 1, wherein said photoresist pattern is a latent image pattern.

3. The method of claim 1, wherein said photoresist pattern is a developed photoresist pattern.

4. A method of processing semiconductor substrates, comprising the following steps:
   forming a photoresist layer including a photoresist pattern over a substrate, said forming step including at least one baking step;
   independently illuminating said photoresist pattern at a plurality of locations on said substrate with a light source, so that light is diffracted off said plurality of locations of said photoresist pattern;
   measuring said diffracted light from said plurality of locations using scatterometry techniques to determine measured diffracted values associated with respective locations from said plurality of locations; and
   comparing said measured diffracted values against a library correlating diffracted values to respective processing temperatures of said photoresist layer during said at least one baking step; and
   from said comparison, determining a processing temperature distribution, said distribution comprising processing temperatures during said at least one baking step for said respective locations from said plurality of locations.

5. The method of claim 4, further comprising the step of controlling a heater used in said at least one baking step based on said processing temperature distribution.

6. The method of claim 5, wherein said controlling step includes the step of adjusting at least one heating element in said heater to provide substantially uniform heating of a photoresist layer at said plurality of locations on subsequently processed substrates.

7. The method of claim 5, wherein said at least one baking step includes a post-exposure baking step.

8. The method of claim 5, wherein said at least one baking step includes a pre-exposure baking step.

9. The method of claim 4, wherein said library includes data associating photoresist pattern profiles with respective processing temperatures.

10. The method of claim 4, wherein said photoresist pattern is a latent image pattern.

11. The method of claim 4, wherein said photoresist pattern is a developed photoresist pattern.

12. The method of claim 4, wherein said at least one baking step comprises heating said substrate with a heater including a plurality of spaced heating elements, said method further comprising adjusting at least one heating element from said plurality of spaced heating elements based on results of said comparison to provide substantially uniform heating of a photoresist layer at said plurality of locations.

13. A method of processing semiconductor substrates, comprising the following steps:
    forming a photoresist layer including a photoresist pattern over a substrate, said forming step including at least one baking step;
    independently illuminating said photoresist pattern at a plurality of locations on said substrate with a light source, so that light is diffracted off said plurality of locations of said photoresist pattern;
    measuring said diffracted light from said plurality of locations using scatterometry techniques to determine measured diffracted values associated with respective locations from said plurality of locations;
    comparing said measured diffracted values against a library correlating diffracted values to respective processing temperatures of said photoresist layer during said at least one baking step, said library including data associating photoresist pattern profiles with respective processing temperatures;
    from said comparison, determining a processing temperature distribution, said distribution comprising processing temperatures during said at least one baking step for said respective locations from said plurality of locations; and
    controlling a heater used in said at least one baking step based on said processing temperature distribution.

14. The method of claim 13, wherein said controlling step includes the step of adjusting at least one heating element in said heater to provide substantially uniform heating of a photoresist layer at said plurality of locations on subsequently processed substrates.

15. The method of claim 13,
    wherein said forming step includes a pre-exposure baking step and a post-exposure baking step,
    wherein said illuminating step occurs before said post-exposure baking step; and
    wherein said controlling step includes the step of adjusting at least one heating element in a heater used in said post-exposure baking step.

16. The method of claim 13, wherein said at least one baking step includes a post-exposure baking step.

17. The method of claim 13, wherein said at least one baking step includes a pre-exposure baking step.

18. The method of claim 13, wherein said photoresist pattern is a latent image pattern.

19. The method of claim 13, wherein said photoresist pattern is a developed photoresist pattern.

20. The method of claim 13, wherein said heater includes a plurality of spaced heating elements, wherein said controlling step includes the step of adjusting at least one heating element from said plurality of spaced heating elements based on results of said comparison to provide substantially uniform heating of a photoresist layer at said plurality of locations.

* * * * *